(12) United States Patent
Yamakawa et al.

(10) Patent No.: US 11,730,060 B2
(45) Date of Patent: Aug. 15, 2023

(54) PIEZOELECTRIC ACTUATOR AND DRIVE METHOD THEREFOR

(71) Applicant: Murata Manufacturing Co., Ltd., Nagaokakyo (JP)

(72) Inventors: Yoshiyuki Yamakawa, Nagaokakyo (JP); Seishiro Goto, Nagaokakyo (JP); Shinichiro Kawada, Nagaokakyo (JP); Shigetoshi Hayashi, Nagaokakyo (JP); Akio Fujita, Nagaokakyo (JP); Yusuke Nakamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 465 days.

(21) Appl. No.: 16/941,705

(22) Filed: Jul. 29, 2020

(65) Prior Publication Data

US 2020/0357977 A1   Nov. 12, 2020

Related U.S. Application Data

(63) Continuation of application No. PCT/JP2019/007771, filed on Feb. 28, 2019.

(30) Foreign Application Priority Data

Mar. 8, 2018 (JP) ................. 2018-041854
Oct. 10, 2018 (JP) ................. 2018-191879

(51) Int. Cl.
*H10N 30/853* (2023.01)
*H10N 30/50* (2023.01)
*H10N 30/87* (2023.01)

(52) U.S. Cl.
CPC ......... *H10N 30/8536* (2023.02); *H10N 30/50* (2023.02); *H10N 30/872* (2023.02)

(58) Field of Classification Search
CPC . H01L 41/0477; H01L 41/047; H01L 41/083; H01L 41/0471; H01L 41/0472;
(Continued)

(56) References Cited

U.S. PATENT DOCUMENTS 8,076,828 B2   12/2011   Kawada
9,184,368 B2   11/2015   Shibayama et al.
(Continued)

FOREIGN PATENT DOCUMENTS

JP   2001230463 A   8/2001
JP   2005285817 A   10/2005
(Continued)

OTHER PUBLICATIONS

International Search Report Issued for PCT/JP2019/007771, dated May 21, 2019.
(Continued)

*Primary Examiner* — J. San Martin
(74) *Attorney, Agent, or Firm* — ArentFox Schiff LLP

(57) ABSTRACT

A piezoelectric actuator that includes a multilayer body, a low-potential outer electrode, and a high-potential outer electrode. The multilayer body includes multiple alternately stacked piezoelectric ceramic layers and planar electrodes. The planar electrodes include low-potential planar electrodes electrically connected to the low-potential outer electrode and high-potential planar electrodes electrically connected to the high-potential outer electrode. The planar electrode positioned most outwardly on the side of a first main surface of the multilayer body is a low-potential planar electrode. The inner surface of this low-potential planar electrode contacts the – side of polarization in an active region, and the outer surface of this low-potential planar electrode is exposed on an outside of the multilayer body. On the side of a second main surface of the multilayer body,
(Continued)

a high-potential planar electrode is not exposed on the outside of the multilayer body.

14 Claims, 5 Drawing Sheets

(58) Field of Classification Search
CPC .... H01L 41/1871; H10N 30/8536; H10N 30/50; H10N 30/872
See application file for complete search history.

(56) References Cited

U.S. PATENT DOCUMENTS

| | | |
|---|---|---|
| 10,333,051 B2 | 6/2019 | Suenaga |
| 2011/0204754 A1 | 8/2011 | Kawada |
| 2015/0035414 A1 | 2/2015 | Shibayama et al. |
| 2017/0133578 A1 | 5/2017 | Suenaga |
| 2020/0357977 A1* | 11/2020 | Yamakawa ........... H01L 41/083 |

FOREIGN PATENT DOCUMENTS

| | | | |
|---|---|---|---|
| JP | 2010161286 A | 7/2010 | |
| JP | 2011049352 A | 3/2011 | |
| JP | 5561483 B2 | 7/2014 | |
| JP | 2015070136 A | 4/2015 | |
| WO | 2013157293 A1 | 10/2013 | |
| WO | 2016031302 A1 | 3/2016 | |
| WO | WO-2016031302 A1 * | 3/2016 | ........... B06B 1/0611 |
| WO | 2016158762 A1 | 10/2016 | |
| WO | WO-2019172064 A1 * | 9/2019 | ........... H01L 41/042 |

OTHER PUBLICATIONS

Written Opinion of the International Searching Authority issued for PCT/JP2019/007771, dated May 21, 2019.
Japanese Office Action issued in corresponding JP Application No. 2020-504964, Japanese Office Action dated Mar. 15, 2022.

* cited by examiner

PIEZOELECTRIC ACTUATOR AND DRIVE METHOD THEREFOR

CROSS REFERENCE TO RELATED APPLICATIONS

The present application is a continuation of International application No. PCT/JP2019/007771, filed Feb. 28, 2019, which claims priority to Japanese Patent Application No. 2018-041854, filed Mar. 8, 2018, and Japanese Patent Application No. 2018-191879, filed Oct. 10, 2018, the entire contents of each of which are incorporated herein by reference.

FIELD OF THE INVENTION

The present invention relates to a piezoelectric actuator and a drive method therefor.

BACKGROUND OF THE INVENTION

These days, there is a growing demand for piezoelectric ceramic electronic components, such as piezoelectric actuators, that achieve a large amount of displacement even with the application of a low voltage.

Typically, this type of piezoelectric ceramic electronic component is manufactured as follows. Ceramic green sheets, which serve as piezoelectric ceramic layers, and conductive layers, which serve as inner electrodes, are alternately stacked on each other and are then co-sintered.

For example, Patent Document 1 discloses a method for manufacturing a piezoelectric actuator by using a lead zirconate titanate (PZT) piezoelectric ceramic material and using Ag-Pd as the material for the inner electrodes.

Lately, for reasons such as environmental issues and concerns, lead-free piezoelectric ceramic materials that can replace lead piezoelectric ceramic materials, such as PZT, are being developed. In particular, an alkali-niobate-compound piezoelectric ceramic material having a perovskite structure (expressed by a general formula of $ABO_3$) in which alkali metal elements, such as K and Na, are disposed in the A site as the primary component and Nb is disposed in the B site as the primary component, exhibits a relatively large piezoelectric constant and is thus attracting a lot of attention. In the case of the use of an alkali-niobate-compound piezoelectric ceramic material, it is preferable that Ni, which is inexpensive and is relatively easy to obtain, be used as a material for the inner electrodes.

Patent Document 2 discloses the following method for manufacturing a piezoelectric actuator. A multilayer body is formed by alternately stacking ceramic green sheets using an alkali niobate compound having a specific composition as the primary component and conductive layers using Ni as the primary component. The multilayer body is fired under a reducing atmosphere, thereby fabricating a piezoelectric ceramic base body. After outer electrodes are formed at both end portions of the piezoelectric ceramic base body, poling treatment is conducted. A piezoelectric actuator is manufactured in this manner.

Patent Document 1: Japanese Unexamined Patent Application Publication No. 2001-230463
Patent Document 2: Japanese Patent No. 5561483

SUMMARY OF THE INVENTION

As disclosed in Patent Document 1, a piezoelectric actuator is manufactured by using a PZT piezoelectric ceramic material. This type of ceramic material does not co-sinter with Ni. This fails to use an inexpensive metal as a material for the inner electrodes, thereby making it difficult to achieve cost reduction.

Manufacturing piezoelectric actuators by using the method disclosed in Patent Document 2 does not cause any problem regarding the initial characteristics and the yield of the piezoelectric actuators. It is known, however, that a sufficient level of reliability is not guaranteed for an electronic component having a multilayer structure in which a piezoelectric ceramic material is co-sintered with Ni under a reducing atmosphere. Here, "reliability" refers to a period of time from the start of the application of a voltage to the electronic component until the occurrence of a failure due to an insulation breakdown. Accordingly, in addition to the issue "enhancing displacement characteristics," which is unique to a piezoelectric actuator, the issue "reducing insulation deterioration," which is peculiar to an electronic component having the above-described multilayer structure, remains to be addressed.

The present invention has been made to solve the above-described problems. It is an object of the present invention to provide a piezoelectric actuator which exhibits high displacement characteristics and can also reduce insulation deterioration. It is another object of the present invention to provide a drive method for this piezoelectric actuator.

A piezoelectric actuator of the present invention includes a multilayer body, a low-potential outer electrode, and a high-potential outer electrode. The multilayer body includes a plurality of alternately stacked piezoelectric ceramic layers and planar electrodes. The multilayer body has first and second main surfaces opposing each other in a stacking direction, first and second end surfaces opposing each other in a longitudinal direction perpendicular to the stacking direction, and first and second side surfaces opposing each other in a widthwise direction perpendicular to the stacking direction and the longitudinal direction. The low-potential outer electrode is disposed on the first end surface of the multilayer body and is configured to receive a first potential. The high-potential outer electrode is disposed on the second end surface of the multilayer body and is configured to receive a second potential that is higher than the first potential. The planar electrodes include a first set of low-potential planar electrodes electrically connected to the low-potential outer electrode and a second set of high-potential planar electrodes electrically connected to the high-potential outer electrode. The first set of low-potential planar electrodes and the second set of high-potential planar electrodes are alternately disposed in the stacking direction. Among the planar electrodes, planar electrodes disposed within the multilayer body contain Ni as a primary component thereof. The piezoelectric ceramic layers contain one of an alkali niobate compound and a barium titanate compound having a perovskite structure as a primary component of the piezoelectric ceramic layers, and define an active region in an area where the first set of low-potential planar electrodes and the second set of high-potential planar electrodes oppose each other. The active region is polarized in a direction from each low-potential planar electrode to a corresponding high-potential planar electrode. A first most outwardly planar electrode on the side of the first main surface of the multilayer body is a first low-potential planar electrode of the first set of low-potential planar electrodes. The inner surface of the first low-potential planar electrode contacts the − side of polarization in the active region, and the outer surface of the first low-potential planar electrode is exposed on an outside of the multilayer body. On the side of the second main surface of the multilayer body, a first high-potential planar electrode is not exposed on the outside of the multilayer body.

The most outwardly planar electrode on the side of the second main surface of the multilayer body may be a second low-potential planar electrode of the first set of low-potential planar electrodes. The inner surface of the second low-potential planar electrode may contact the − side of polarization in the active region, and the outer surface of the second low-potential planar electrode may be exposed on the outside of the multilayer body.

The most outwardly planar electrode on the side of the second main surface of the multilayer body may be a second low-potential planar electrode of the first set of low-potential planar electrodes. The inner surface of the second low-potential planar electrode may contact the − side of polarization in the active region, and the outer surface of the second low-potential planar electrode may contact an adjacent piezoelectric ceramic layer of the piezoelectric ceramic layers.

The most outwardly planar electrode on the side of the second main surface of the multilayer body may be a second high-potential planar electrode of the second set of high-potential planar electrodes. The inner surface of the second high-potential planar electrode may contact the + side of polarization in the active region, and the outer surface of the second high-potential planar electrode may contact an adjacent piezoelectric ceramic layer of the piezoelectric ceramic layers.

A method for driving the piezoelectric actuator according to the present invention includes applying a first potential to the low-potential outer electrode and applying a second potential to the high-potential outer electrode, the second potential being higher than the first potential. The first and second potentials may be of the same polarity or one of the first and second potentials may be a ground potential.

According to the present invention, it is possible to provide a piezoelectric actuator which exhibits high displacement characteristics and can also reduce insulation deterioration.

DETAILED DESCRIPTION OF THE PREFERRED EMBODIMENTS

Figure 1A:
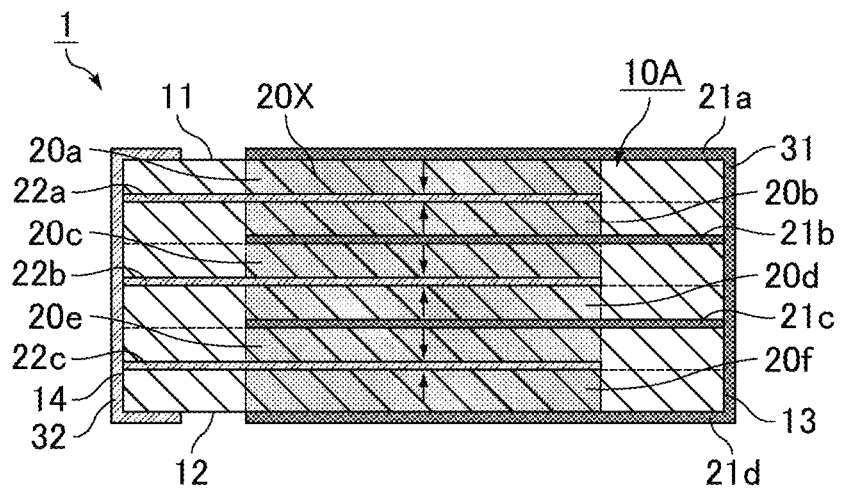
FIG. 1(a) is a sectional view schematically illustrating an example of a piezoelectric actuator according to a first embodiment of the present invention.

A piezoelectric actuator according to the present invention will be described below.

The present invention is not, however, restricted to the following configurations and may be modified in an appropriate manner without departing from the spirit and scope of the invention. Combinations of two or more of the desirable configurations discussed below are also encompassed within the invention.

In the piezoelectric actuator of the present invention, on the side of a first main surface of a multilayer body, a low-potential planar electrode which contacts a − side of polarization in an active region of piezoelectric ceramic layers is exposed on an outside of the multilayer body, while, on a side of a second main surface of the multilayer body, a high-potential planar electrode which contacts a + side of polarization in the active region of the piezoelectric ceramic layers is not exposed on the outside of the multilayer body.

The present inventors have made the following discovery through their examinations. If a high-potential planar electrode which contacts the + side of polarization in the active region of piezoelectric ceramic layers is exposed on an outside of the multilayer body, insulation deterioration occurs at a portion of this high-potential planar electrode in the vicinity of its adjacent outer electrode. This becomes a bottleneck and influences the reliability of a piezoelectric actuator. Insulation deterioration may be caused by oxygen deficiency during the firing under a reducing atmosphere. In the piezoelectric actuator of the present invention, high-potential planar electrodes are not exposed on an outside on the main surfaces of the multilayer body, thereby eliminating the above-described bottleneck concerning insulation deterioration. It is thus possible to improve the reliability in terms of the driving time for the piezoelectric actuator with the application of a voltage.

The present inventors have also discovered that, even if a low-potential planar electrode which contacts the − side of polarization in the active region of piezoelectric ceramic layers is exposed on an outside of the multilayer body, the reliability can be guaranteed. If no planar electrode is exposed on an outside of the multilayer body and piezoelectric ceramic layers are disposed as the outermost layers on the two opposed main surfaces of the multilayer body, these piezoelectric ceramic layers are not displaced even with the application of a voltage and accordingly do not contribute to the displacement. This is not preferable. In the piezoelectric actuator of the present invention, a low-potential planar electrode is exposed on an outside on at least the first main surface of the multilayer body, thereby enhancing the displacement characteristics. Additionally, the low-potential planar electrode exposed on the outside can be used as an outer electrode, thereby facilitating the connection with an external source.

The individual embodiments described below are only examples, and the configurations described in the different embodiments may partially be replaced by or combined with each other. From a second embodiment onward, points different from a first embodiment will be mainly explained while omitting the same points as the first embodiment. An explanation of similar advantages obtained by similar configurations will not be repeated.

[First Embodiment]

In the first embodiment, the planar electrode positioned most outwardly on the side of a first main surface of a multilayer body is a low-potential planar electrode. The inner surface of the low-potential planar electrode contacts the − side of polarization in the active region, while the outer surface of the low-potential planar electrode is exposed on an outside of the multilayer body. The planar electrode positioned most outwardly on the side of the second main surface of the multilayer body is also a low-potential planar electrode. The inner surface of the low-potential planar electrode contacts the − side of polarization in the active region, while the outer surface of the low-potential planar electrode is exposed to the outside of the multilayer body. The high-potential planar electrode positioned most outwardly on the side of the first main surface of the multilayer body is disposed between piezoelectric ceramic layers. Likewise, the high-potential planar electrode positioned most outwardly on the side of the second main surface of the multilayer body is disposed between piezoelectric ceramic layers.

Because of the above-described structure in which the high-potential planar electrodes are not exposed on the outside of the multilayer body, it is possible to reduce insulation deterioration which would occur at a portion of a high-potential planar electrode exposed to outside air. Hence, the reliability, that is, the period of time for which the piezoelectric actuator is driven with the application of a voltage, can be enhanced.

Additionally, in the first embodiment, all the piezoelectric ceramic layers are polarized and thus contribute to the displacement, thereby obtaining high displacement characteristics.

Figure 1B:
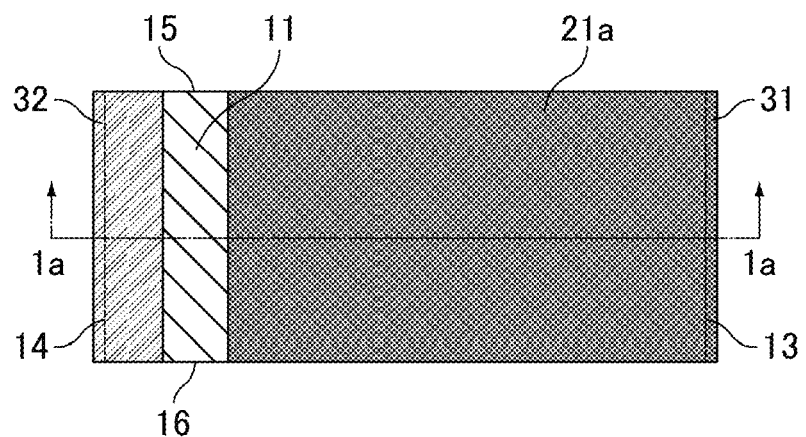
FIG. 1(b) is a plan view of the piezoelectric actuator shown in FIG. 1(a) when one main surface is seen from above.
Figure 1C:
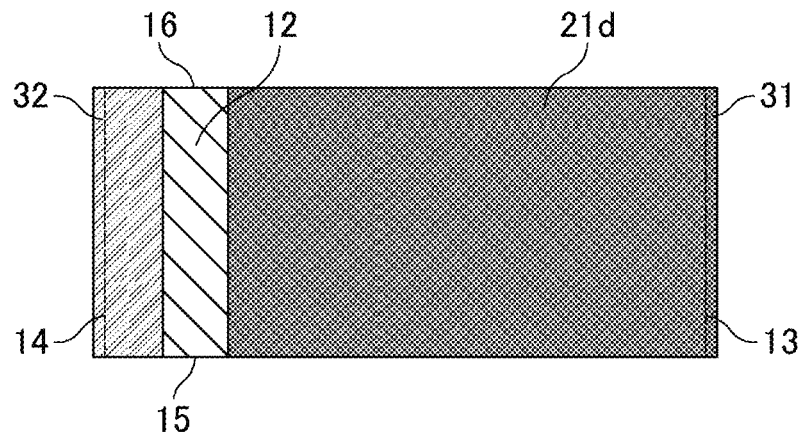
FIG. 1(c) is a plan view of the piezoelectric actuator shown in FIG. 1(a) when the other main surface is seen from above.

FIG. 1(a) is a sectional view schematically illustrating an example of a piezoelectric actuator according to the first embodiment of the present invention. FIG. 1(b) is a plan view of the piezoelectric actuator shown in FIG. 1(a) when one main surface is seen from above. FIG. 1(c) is a plan view of the piezoelectric actuator shown in FIG. 1(a) when the other main surface is seen from above. FIG. 1(a) is a sectional view taken along line 1a-1a in FIG. 1(b).

A piezoelectric actuator 1 shown in FIG. 1(a) includes a multilayer body 10A. The multilayer body 10A has a multilayer structure in which piezoelectric ceramic layers 20a, 20b, 20c, 20d, 20e, and 20f and planar electrodes 21a, 22a, 21b, 22b, 21c, 22c, and 21d are alternately stacked on each other.

The piezoelectric ceramic layers 20a, 20b, 20c, 20d, 20e, and 20f use an alkali niobate compound or a barium titanate compound having a perovskite structure as the primary component thereof. In this manner, the piezoelectric ceramic layers are made of an alkali-niobate-compound piezoelectric ceramic material or a barium-titanate-compound piezoelectric ceramic material.

For an alkali-niobate-compound piezoelectric ceramic material, the component expressed by the following formula, for example, is used as the primary component:

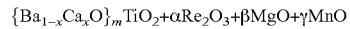

where M2 is a divalent metal element and M4 is a tetravalent metal element, and x, a, b, and c may be 0. When x>0, M2M4O₃ forms a solid solution with (K, Na, Li) (Nb, Ta)O₃. When a>0, part of K is replaced with Na. When b>0, part of K is replaced with Li. When c>0, part of Nb is replaced with Ta.

For a barium-titanate-compound piezoelectric ceramic material, the component expressed by the following composition formula can be used:

$$\{Ba_{1-x}Ca_xO\}_m TiO_2 + \alpha Re_2O_3 + \beta MgO + \gamma MnO$$

where $Re_2O_3$ is at least one of compounds selected from $Y_2O_3$, $Gd_2O_3$, $Tb_2O_3$, $Dy_2O_3$, $Ho_2O_3$, $Er_2O_3$, and $Yb_2O_3$, and α, β, and γ represent the mole ratio, and the above-described formula satisfies the following relational expressions (1) through (4).

$$\alpha:\beta:\gamma = 2.5:2.2:1 \quad (1)$$

$$0.0002 \leq \gamma \leq (-13.06m + 13.54)/100 \quad (2)$$

$$0.995 \leq m \leq 1.011 \quad (3)$$

$$x = 0.13 \quad (4)$$

The barium-titanate-compound piezoelectric ceramic material may be defined as follows.

The piezoelectric ceramic material includes an oxide containing Ba, Ca, Ti, Mg, Mn, and Re (Re is at least one of elements selected from Y, Gd, Tb, Dy, Ho, Er, and Yb), and the oxide satisfies the following relational expressions (1) through (4) when the total content of Ba and Ca is m moles, the content of Re is α moles, the content of Mg is β moles, and the content of Mn is γ moles with respect to one mole of Ti1.

$$\alpha:\beta:\gamma = 5:2.2:1 \quad (1)$$

$$0.0002 \leq \gamma \leq (-13.06\ m + 13.54)/100 \quad (2)$$

$$0.995 \leq m \leq 1.011 \quad (3)$$

The mole ratio of Ba and Ca is Ba:Ca=0.87:0.13 (4)

In this specification, "primary component" is the component having the largest content ratio (mole %), and more desirably, the component whose content ratio is greater than 50 mole %.

Among the planar electrodes, the planar electrodes 22a, 21b, 22b, 21c, and 22c located inside the multilayer body 10A use Ni as the primary component and are co-sintered with the piezoelectric ceramic layers 20a, 20b, 20c, 20d, 20e, and 20f. The planar electrodes 21a and 21d exposed on the outside are made of the same conductive material, such as a Ni-Cr alloy (nichrome) and Ag, as a low-potential outer electrode 31 which will be discussed later.

The multilayer body 10A is formed in the shape of a rectangular parallelepiped or a substantially rectangular parallelepiped, and has first and second main surfaces 11 and 12, first and second end surfaces 13 and 14, and first and second side surfaces 15 and 16 (see FIG. 1(b) and FIG. 1(c)). The first and second main surfaces 11 and 12 oppose each other in the stacking direction (top-bottom direction in FIG. 1(a)). The first and second end surfaces 13 and 14 oppose each other in the longitudinal direction (left-right direction in FIG. 1(a)) perpendicular to the stacking direction. The first and second side surfaces 15 and 16 oppose each other in the widthwise direction (front-back direction in FIG. 1(a)) perpendicular to the stacking direction and the longitudinal direction.

The piezoelectric actuator 1 shown in FIG. 1(a) also includes a low-potential outer electrode 31 disposed on the first end surface 13 of the multilayer body 10A and a high-potential outer electrode 32 disposed on the second end surface 14 of the multilayer body 10A. The low-potential outer electrode 31 and the high-potential outer electrode 32 are made of a conductive material, such as a Ni—Cr alloy (nichrome) and Ag.

The low-potential outer electrode 31 is an outer electrode to which a first potential is applied. The high-potential outer electrode 32 is an outer electrode to which a second potential, which is higher than the first potential, is applied. The first and second potentials are of the same polarity or one of them is a ground potential. For example, a ground potential is applied to the low-potential outer electrode 31, while a positive potential is applied to the high-potential outer electrode 32. Other examples of combinations of a low potential and a high potential are a negative potential and a ground potential, a positive potential and a positive potential, and a negative potential and a negative potential.

Among the planar electrodes, the planar electrodes 21a, 21b, 21c, and 21d are low-potential planar electrodes, each of which is electrically connected at one end to the low-potential outer electrode 31. Among the planar electrodes, the planar electrodes 22a, 22b, and 22c are high-potential planar electrodes, each of which is electrically connected at one end to the high-potential outer electrode 32. The low-potential planar electrodes 21a, 21b, 21c, and 21d and the high-potential planar electrodes 22a, 22b, and 22c are alternately disposed in the stacking direction and oppose each other with the piezoelectric ceramic layers 20a, 20b, 20c, 20d, 20e, and 20f interposed therebetween.

The piezoelectric ceramic layers 20a, 20b, 20c, 20d, 20e, and 20f include an active region 20X in the area where the low-potential planar electrodes 21a, 21b, 21c, and 21d and the high-potential planar electrodes 22a, 22b, and 22c oppose each other. The active region 20X is a region which is polarized in a direction from the low-potential planar electrodes to the corresponding high-potential planar electrodes.

In this specification, "active region" refers to a polarized region which is sandwiched between the opposing planar electrodes of different potentials.

In FIG. 1(a), the orientations of polarization in the active region 20X are indicated by the arrows, and the heads of the arrows represent the + side of polarization, while the tails of the arrows represent the − side of polarization.

The orientations of polarization can be checked with a $d_{33}$ meter, for example. More specifically, a positive-polarity probe and a negative-polarity probe of the $d_{33}$ meter are connected to the corresponding outer electrodes of the piezoelectric actuator. Then, a stress is applied to the piezoelectric actuator in the stacking direction. If the measured d value is positive, the planar electrodes located closer to the outer electrode connected to the positive-polarity probe are the + side of polarization, while the planar electrodes located closer to the outer electrode connected to the negative-polarity probe are the − side of polarization. If the measured d value is negative, the + side and − side of polarization are opposite to those described above.

As shown in FIG. 1(a) and FIG. 1(b), the planar electrode positioned most outwardly on the side of the first main surface 11 of the multilayer body 10A is the low-potential planar electrode 21a. The inner surface of the low-potential planar electrode 21a contacts the − side of polarization in the active region 20X, while the outer surface of the low-potential planar electrode 21a is exposed on the outside of the multilayer body.

As shown in FIG. 1(a) and FIG. 1(c), the planar electrode positioned most outwardly on the side of the second main surface 12 of the multilayer body 10A is the low-potential planar electrode 21d. The inner surface of the low-potential planar electrode 21d contacts the − side of polarization in the active region 20X, while the outer surface of the low-potential planar electrode 21d is exposed on the outside of the multilayer body.

In this specification, "being positioned most outwardly" means being positioned most outwardly in the stacking direction.

As shown in FIG. 1(a), the high-potential planar electrode 22a is located between the piezoelectric ceramic layers 20a and 20b. The high-potential planar electrode 22b is located between the piezoelectric ceramic layers 20c and 20d. The high-potential planar electrode 22c is located between the piezoelectric ceramic layers 20e and 20f. The low-potential planar electrode 21b is located between the piezoelectric ceramic layers 20b and 20c. The low-potential planar electrode 21c is located between the piezoelectric ceramic layers 20d and 20e.

As shown in FIG. 1(a), FIG. 1(b), and FIG. 1(c), the high-potential outer electrode 32 may extend to part of each of the first and second main surfaces 11 and 12, which is not the active region 20X. In this case, the high-potential outer electrode 32 is disposed in a region on the first main surface 11, which is not the active region 20X, and also in a region on the second main surface 12, which is not the active region 20X. As shown in FIG. 1(b), the area of the high-potential outer electrode 32 on the first main surface 11 is smaller than that of the low-potential planar electrode 21a on the first main surface 11. As shown in FIG. 1(c), the area of the high-potential outer electrode 32 on the second main surface 12 is smaller than that of the low-potential planar electrode 21d on the second main surface 12.

The piezoelectric actuator according to the first embodiment of the present invention is manufactured preferably by the following method.

If an alkali-niobate-compound piezoelectric ceramic material is used for forming the piezoelectric ceramic layers, a K compound containing K, a Na compound containing Na, and a Nb compound containing Nb are prepared as the ceramic material. A Li compound containing Li, an M2 compound containing an M2 metal, and an M4 element containing an M4 metal, for example, are prepared if necessary. The form of a compound may be any one of an oxide, a carbonate, and a hydroxide.

After a predetermined amount of the above-described ceramic material is weighed, it is loaded into a ball mill or a pot mill containing grinding media, such as PSZ (partially stabilized zirconia) balls. The ceramic material is subjected to wet grinding in a solvent, such as ethanol, thereby resulting in a mixture.

After the mixture is dried, it is calcined at a predetermined temperature (850 to 1000° C., for example), thereby resulting in a synthesized calcined material.

After the calcined material is crushed, an organic binder and a dispersant are added thereto. The calcined material with the organic binder and the dispersant is then subjected to wet-blending in a ball mill using purified water as a solvent, thereby resulting in ceramic slurry. Then, the ceramic slurry is subjected to forming processing by doctor blading, for example, thereby fabricating a ceramic green sheet.

The ceramic green sheet undergoes screen-printing with a conductive paste containing Ni as the primary component, thereby forming a conductive layer having a predetermined pattern on the ceramic green sheet.

Ceramic green sheets having the conductive layers formed thereon are stacked on each other and are pressure-bonded. As a result, a ceramic multilayer body including the conductive layers and the ceramic green sheets alternately stacked on each other is fabricated. The ceramic multilayer body is cut into individual portions of a predetermined size. The individual portions of the multilayer body are then placed in an alumina saggar and are subjected to debinding processing at a predetermined temperature (250 to 500° C., for example) and are then fired under a reducing atmosphere at a predetermined temperature (1000 to 1160° C., for example). As a result, a piezoelectric ceramic base body (multilayer body) having planar electrodes embedded therein is fabricated.

A low-potential outer electrode and a high-potential outer electrode made of nichrome and Ag are formed on the end surfaces of the piezoelectric ceramic base body by sputtering. At this time, low-potential planar electrodes to be exposed outside are also formed by sputtering.

Thereafter, predetermined poling treatment is conducted. As a result, a piezoelectric actuator is manufactured.

If a barium-titanate-compound piezoelectric ceramic material is used for forming the piezoelectric ceramic layers, a ceramic material containing elements to form a barium titanate compound is used. As the ceramic material, raw material powder produced by solid-phase synthesis in which an oxide or a carbonate is reacted at a high temperature and raw material powder produced by wet synthesis, such as alkoxide synthesis and hydrothermal synthesis, are prepared. As the additives, an alkoxide solution and an organic metal solution may be used, as well as oxide powder and carbonate powder.

[Second Embodiment]

In a second embodiment, the planar electrode positioned most outwardly on the side of the first main surface of a multilayer body is a low-potential planar electrode. The inner surface of the low-potential planar electrode contacts the − side of polarization in the active region, while the outer surface of the low-potential planar electrode is exposed on the outside of the multilayer body. The planar electrode positioned most outwardly on the side of the second main surface of the multilayer body is also a low-potential planar electrode. The inner surface of the low-potential planar electrode contacts the − side of polarization in the active region, while the outer surface of the low-potential planar electrode contacts a piezoelectric ceramic layer. The high-potential planar electrode positioned most outwardly on the side of the first main surface of the multilayer body is disposed between piezoelectric ceramic layers. Likewise, the high-potential planar electrode positioned most outwardly on the side of the second main surface of the multilayer body is disposed between piezoelectric ceramic layers.

Figure 2A:
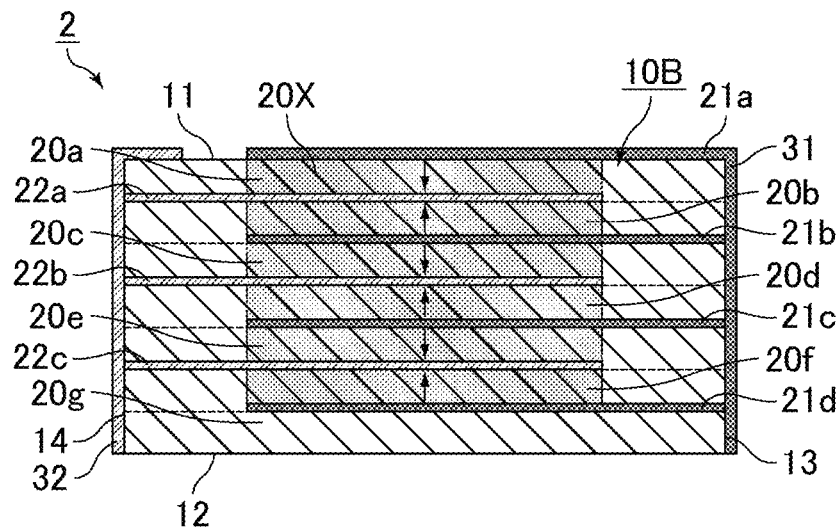
FIG. 2(a) is a sectional view schematically illustrating an example of a piezoelectric actuator according to a second embodiment of the present invention.
Figure 2B:
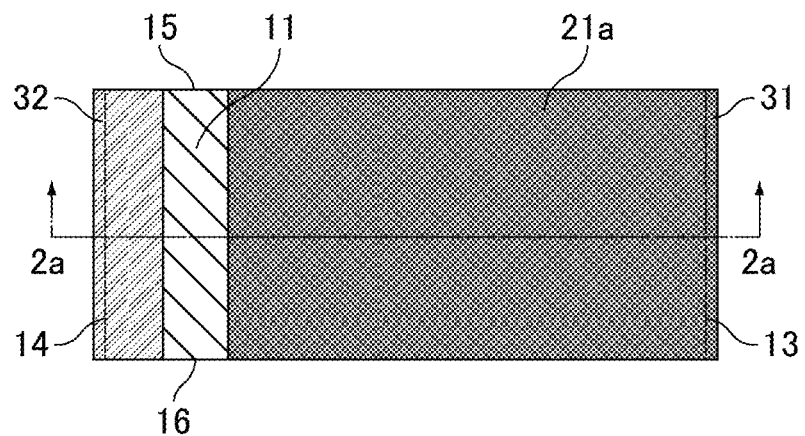
FIG. 2(b) is a plan view of the piezoelectric actuator shown in FIG. 2(a) when one main surface is seen from above.
Figure 2C:
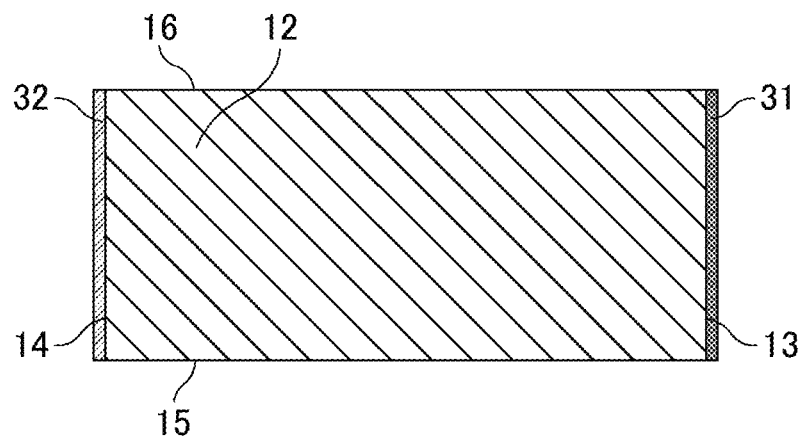
FIG. 2(c) is a plan view of the piezoelectric actuator shown in FIG. 2(a) when the other main surface is seen from above.

FIG. 2(a) is a sectional view schematically illustrating an example of a piezoelectric actuator according to a second embodiment of the present invention. FIG. 2(b) is a plan view of the piezoelectric actuator shown in FIG. 2(a) when the first main surface is seen from above. FIG. 2(c) is a plan view of the piezoelectric actuator shown in FIG. 2(a) when the second main surface is seen from above. FIG. 2(a) is a sectional view taken along line 2a-2a in FIG. 2(b).

A piezoelectric actuator 2 shown in FIG. 2(a) includes a multilayer body 10B. The multilayer body 10B has a multilayer structure in which piezoelectric ceramic layers 20a, 20b, 20c, 20d, 20e, 20f, and 20g and planar electrodes 21a, 22a, 21b, 22b, 21c, 22c, and 21d are alternately stacked on each other.

The piezoelectric actuator 2 shown in FIG. 2(a) also includes a low-potential outer electrode 31 disposed on the first end surface 13 of the multilayer body 10B and a high-potential outer electrode 32 disposed on the second end surface 14 of the multilayer body 10B.

Among the planar electrodes, the planar electrodes 21a, 21b, 21c, and 21d are low-potential planar electrodes, each of which is electrically connected at one end to the low-potential outer electrode 31. Among the planar electrodes, the planar electrodes 22a, 22b, and 22c are high-potential planar electrodes, each of which is electrically connected at one end to the high-potential outer electrode 32. The low-potential planar electrodes 2a, 21b, 21c, and 21d and the high-potential planar electrodes 22a, 22b, and 22c are alternately disposed in the stacking direction and oppose each other with the piezoelectric ceramic layers 20a, 20b, 20c, 20d, 20e, and 20f interposed therebetween.

As shown in FIG. 2(a) and FIG. 2(b), the planar electrode positioned most outwardly on the side of the first main surface 11 of the multilayer body 10B is the low-potential planar electrode 21a. The inner surface of the low-potential planar electrode 21a contacts the − side of polarization in the active region 20X, while the outer surface of the low-potential planar electrode 21a is exposed on the outside of the multilayer body.

As shown in FIG. 2(a) and FIG. 2(c), the planar electrode positioned most outwardly on the side of the second main surface 12 of the multilayer body 10B is the low-potential planar electrode 21d. The inner surface of the low-potential planar electrode 21d contacts the − side of polarization in the active region 20X, while the outer surface of the low-potential planar electrode 21d contacts the piezoelectric ceramic layer 20g.

As shown in FIG. 2(a), the high-potential planar electrode 22a is located between the piezoelectric ceramic layers 20a and 20b. The high-potential planar electrode 22b is located between the piezoelectric ceramic layers 20c and 20d. The high-potential planar electrode 22c is located between the piezoelectric ceramic layers 20e and 20f. The low-potential planar electrode 21b is located between the piezoelectric ceramic layers 20b and 20c. The low-potential planar electrode 21c is located between the piezoelectric ceramic layers 20d and 20e. The low-potential planar electrode 21d is located between the piezoelectric ceramic layers 20f and 20g.

In the second embodiment of the present invention, the outermost piezoelectric ceramic layer on both sides of which planar electrodes do not oppose each other may be polarized. For example, in the piezoelectric actuator 2 shown in FIG. 2(a), the piezoelectric ceramic layer 20g may be polarized.

[Third Embodiment]

In a third embodiment, the planar electrode positioned most outwardly on the side of the first main surface of a multilayer body is a low-potential planar electrode. The inner surface of the low-potential planar electrode contacts the − side of polarization in the active region, while the outer surface of the low-potential planar electrode is exposed on the outside of the multilayer body. The planar electrode positioned most outwardly on the side of the second main surface of the multilayer body is a high-potential planar electrode. The inner surface of the high-potential planar electrode contacts the + side of polarization in the active region, while the outer surface of the high-potential planar electrode contacts a piezoelectric ceramic layer. The high-potential planar electrode positioned most outwardly on the side of the first main surface of the multilayer body is disposed between piezoelectric ceramic layers. Likewise, the high-potential planar electrode positioned most outwardly on the side of the second main surface of the multilayer body is disposed between piezoelectric ceramic layers.

Figure 3A:
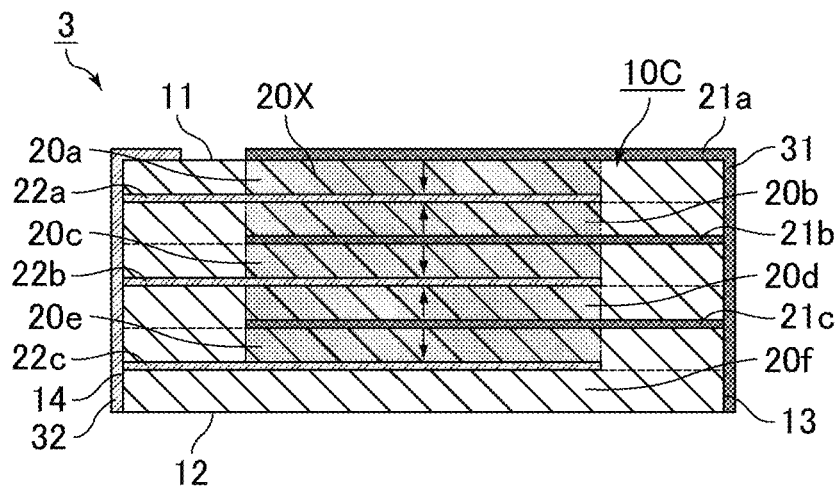
FIG. 3(a) is a sectional view schematically illustrating an example of a piezoelectric actuator according to a third embodiment of the present invention.
Figure 3B:
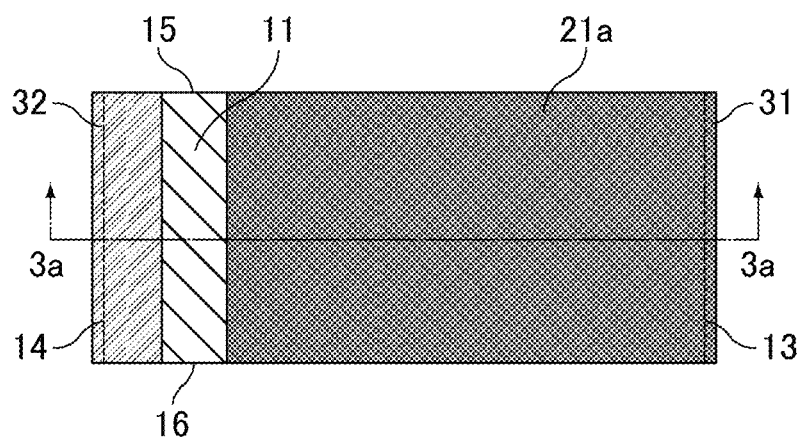
FIG. 3(b) is a plan view of the piezoelectric actuator shown in FIG. 3(a) when one main surface is seen from above.
Figure 3C:
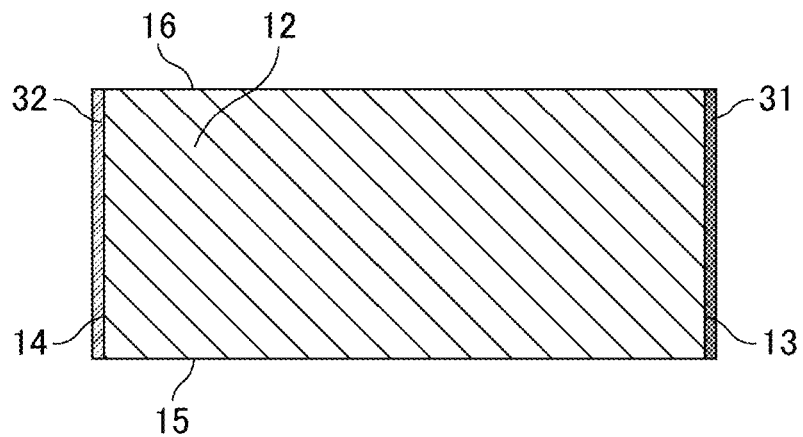
FIG. 3(c) is a plan view of the piezoelectric actuator shown in FIG. 3(a) when the other main surface is seen from above.

FIG. 3(a) is a sectional view schematically illustrating an example of a piezoelectric actuator according to a third embodiment of the present invention. FIG. 3(b) is a plan view of the piezoelectric actuator shown in FIG. 3(a) when the first main surface is seen from above. FIG. 3(c) is a plan view of the piezoelectric actuator shown in FIG. 3(a) when the second main surface is seen from above. FIG. 3(a) is a sectional view taken along line 3a-3a in FIG. 3(b).

A piezoelectric actuator 3 shown in FIG. 3(a) includes a multilayer body 10C. The multilayer body 10C has a multilayer structure in which piezoelectric ceramic layers 20a, 20b, 20c, 20d, 20e, and 20f and planar electrodes 21a, 22a, 21b, 22b, 21c, and 22c are alternately stacked on each other.

The piezoelectric actuator 3 shown in FIG. 3(a) also includes a low-potential outer electrode 31 disposed on the first end surface 13 of the multilayer body 10C and a high-potential outer electrode 32 disposed on the second end surface 14 of the multilayer body 10C.

Among the planar electrodes, the planar electrodes 21a, 21b, and 21c are low-potential planar electrodes, each of which is electrically connected at one end to the low-potential outer electrode 31. Among the planar electrodes, the planar electrodes 22a, 22b, and 22c are high-potential planar electrodes, each of which is electrically connected at one end to the high-potential outer electrode 32. The low-potential planar electrodes 21a, 21b, and 21c and the high-potential planar electrodes 22a, 22b, and 22c are alternately disposed in the stacking direction and oppose each other with the piezoelectric ceramic layers 20a, 20b, 20c, 20d, and 20e interposed therebetween.

As shown in FIG. 3(a) and FIG. 3(b), the planar electrode positioned most outwardly on the side of the first main surface 11 of the multilayer body 10C is the low-potential planar electrode 21a. The inner surface of the low-potential planar electrode 21a contacts the − side of polarization in the active region 20X, while the outer surface of the low-potential planar electrode 21a is exposed on the outside of the multilayer body.

As shown in FIG. 3(a) and FIG. 3(c), the planar electrode positioned most outwardly on the side of the second main surface 12 of the multilayer body 10C is the high-potential planar electrode 22c. The inner surface of the high-potential planar electrode 22c contacts the + side of polarization in the active region 20X, while the outer surface of the high-potential planar electrode 22c contacts the piezoelectric ceramic layer 20f.

As shown in FIG. 3(a), the high-potential planar electrode 22a is located between the piezoelectric ceramic layers 20a and 20b. The high-potential planar electrode 22b is located between the piezoelectric ceramic layers 20c and 20d. The high-potential planar electrode 22c is located between the piezoelectric ceramic layers 20e and 20f. The low-potential planar electrode 21b is located between the piezoelectric ceramic layers 20b and 20c. The low-potential planar electrode 21c is located between the piezoelectric ceramic layers 20d and 20e.

In the third embodiment of the present invention, the outermost piezoelectric ceramic layer on both sides of which planar electrodes do not oppose each other may be polarized. For example, in the piezoelectric actuator 3 shown in FIG. 3(a), the piezoelectric ceramic layer 20f may be polarized.

[Other Embodiments]

The piezoelectric actuator of the present invention is not restricted to the above-described embodiments, and various applications and modifications may be made to the embodiments in terms of the configuration and manufacturing conditions of the piezoelectric actuator, for example, without departing from the technical scope of the invention. For example, the number of piezoelectric ceramic layers and that of planar electrodes stacked on each other are not particularly limited.

In the piezoelectric actuator of the present invention, the low-potential outer electrode may extend to the first and second main surfaces of the multilayer body, but it may alternatively be disposed only on at least part of the first end surface of the multilayer body. Likewise, the high-potential outer electrode may extend to the first and second main surfaces of the multilayer body, but it may alternatively be disposed only on at least part of the second end surface of the multilayer body.

As discussed in the second and third embodiments, in the piezoelectric actuator of the present invention, the piezoelectric ceramic layer which contacts the outer surface of the most outwardly positioned planar electrode may include a polarized region.

When a first potential is applied to the low-potential outer electrode and a second potential, which is higher than the first potential, is applied to the high-potential outer electrode, the piezoelectric actuator of the present invention is displaced by the greatest amount in a direction perpendicular to the stacking direction. As discussed above, the first and second potentials are of the same polarity or one of them is a ground potential. Such a drive method for the piezoelectric actuator is also encompassed within the present invention.

EXAMPLES

A description will be given of examples in which the piezoelectric actuator of the present invention is disclosed more specifically. However, the present invention is not restricted to these examples.

[Fabrication of Piezoelectric Actuator]

First Example

As the ceramic material, $K_2CO_3$, $Na_2CO_3$, $Li_2O_3$, $Nb_2O_5$, $BaCO_3$, $ZrO_2$, $La_2O_3$, and $MnCO_3$ were prepared and weighed to form the following ceramic composition: $0.925(K_{0.43}Na_{0.51}Li_{0.06})NbO_3$–$0.075BaZrO_3$+$0.025ZrO_2$+$0.0025La_2O_3$+$0.005MnO$. In this composition, the primary component is "$0.925(K_{0.43}Na_{0.51}Li_{0.06})NbO_3$–$0.075BaZrO_3$", and the secondary component is "$0.025ZrO_2$+$0.0025La_2O_3$+$0.005MnO$".

After the ceramic material was weighed, it was loaded into a pot mill containing PSZ balls. The pot mill was rotated for about 90 hours by using a solvent, such as ethanol, so that the ceramic material was subjected to wet-blending. After the resulting mixture was dried, it was calcined at a temperature of 900° C., thereby obtaining a calcined material.

After the obtained calcined material was crushed, it was loaded into a pot mill with a binder, a dispersant, purified water, and PSZ balls. The calcined material was then subjected to wet-blending by rotating the pot mill. Then, the resulting ceramic mixture was subjected to forming processing by doctor blading, thereby forming a ceramic green sheet having a thickness of 33 μm.

The ceramic green sheet underwent screen-printing with a conductive paste containing Ni as the primary component, thereby forming a conductive layer having a predetermined pattern on the ceramic green sheet. A predetermined number of ceramic green sheets having conductive layers formed thereon were stacked on each other and were pressure-bonded, thereby fabricating a ceramic multilayer body.

The ceramic multilayer body was fired for two hours under a reducing atmosphere at a temperature of 1050° C. As a result, a piezoelectric ceramic base body (multilayer body) was fabricated.

As shown in FIG. 1(a), FIG. 1(b), and FIG. 1(c), the low-potential planar electrode 21a, the low-potential planar electrode 21d, the low-potential outer electrode 31, and the high-potential outer electrode 32 made of nichrome and Ag were formed by sputtering. Thereafter, poling treatment was conducted by applying an electric field of 3 kV/mm in the room-temperature air for four minutes.

As a result, a piezoelectric actuator according to a first example was fabricated. The number of piezoelectric ceramic layers stacked on each other is six. The piezoelectric actuator has a length of 13 mm and a width of 3 mm.

Second Example

In a second example, a piezoelectric actuator was fabricated in a manner similar to the first example, except that the low-potential planar electrode 21a, the low-potential outer electrode 31, and the high-potential outer electrode 32 made of nichrome and Ag were formed by sputtering, as shown in FIG. 2(a), FIG. 2(b), and FIG. 2(c). The number of piezoelectric ceramic layers stacked on each other is seven.

Third Example

As starting materials, $TiO_2$, $BaCO_3$, and $CaCO_3$ were prepared. After the starting materials were ground and mixed, they were heated at a temperature of 1000° C. or higher, thereby synthesizing barium calcium titanate. To measure the particle sizes of the materials, a scanning electron microscope was used, and the average particle size was found to be 0.5 μm. As the secondary component, $SiO_2$ powder was prepared.

Then, $BaCO_3$ or $TiO_2$ for adjusting the (Ba, Ca)/Ti mole ratio m of barium calcium titanate, and $Dy_2O_3$, MgO, and MnO having a purity of 99% or higher were prepared. These material powders and $SiO_2$ powder, which served as the secondary component, were weighed. The additive amount of $SiO_2$ was determined by parts by weight with respect to 100 parts by weight of the primary component $[\{Ba_{0.87}Ca_{0.13}O\}_m TiO_2 + \alpha Dy_2O_3 + \beta MgO + \gamma MnO]$. Specifically, the additive amount of $SiO_2$ was set to be 0.4 parts by weight. Regarding α, β, and γ, β was slightly increased with respect to the stoichiometric ratio, so that α:β:γ becomes 2.5:2.2:1, thereby making the material slightly acceptor-rich. Although $Dy_2O_3$ was used as $Re_2O_3$, the use of one of compounds selected from $Y_2O_3$, $Gd_2O_3$, $Tb_2O_3$, $Ho_2O_3$, $Er_2O_3$, and $Yb_2O_3$ achieves similar advantages.

The mole ratio m was 1.011, and γ was 0.0034.

Then, a polyvinyl butyral binder and an organic solvent, such as ethanol, were added to the weighed materials, and the materials were subjected to wet-blending in a ball mill, thereby resulting in ceramic slurry. The ceramic slurry was formed into a sheet by doctor blading, thereby forming a ceramic green sheet.

By using this ceramic green sheet, a conductive layer was formed similarly to the first example. Ceramic green sheets having conductive layers formed thereon were stacked on each other and were pressure-bonded, thereby fabricating a ceramic multilayer body.

The ceramic multilayer body was heated to 300° C. in the atmospheric atmosphere so as to burn the binder, and was then fired for two hours at a temperature of 1200 to 1300° C. under a reducing atmosphere made from an $H_2$-$N_2$-$H_2O$ gas having an oxygen partial pressure of $10^{-9}$ to $10^{-12}$ Mpa. As a result, a piezoelectric ceramic base body (multilayer body) was fabricated.

Outer electrodes, such as those shown in FIG. 1(a), FIG. 1(b), and FIG. 1(c), were formed so that the structure of the piezoelectric ceramic base body would be similar to that in the first example, and then, poling treatment was conducted. As a result, a piezoelectric actuator was fabricated in a manner similar to the first example.

First Comparative Example

Figure 4A:
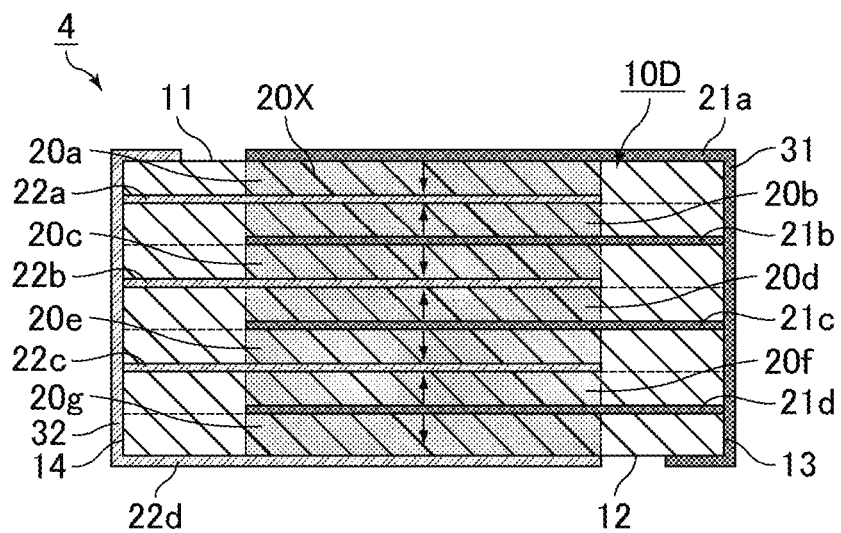
FIG. 4(a) is a sectional view schematically illustrating an example of a known piezoelectric actuator.
Figure 4B:
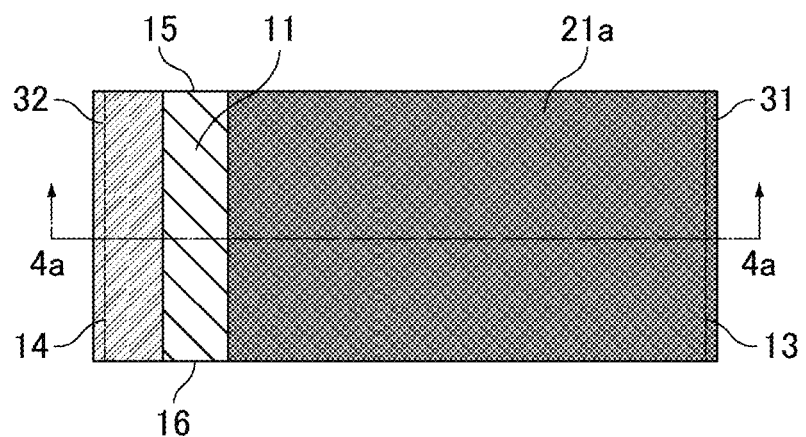
FIG. 4(b) is a plan view of the piezoelectric actuator shown in FIG. 4(a) when one main surface is seen from above.
Figure 4C:
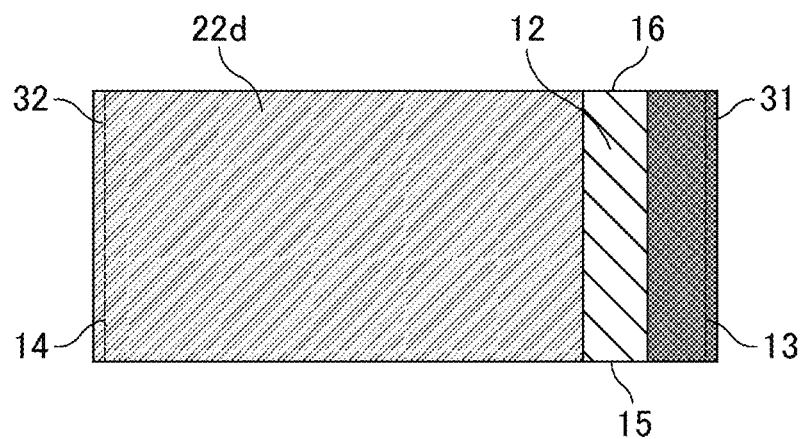
FIG. 4(c) is a plan view of the piezoelectric actuator shown in FIG. 4(a) when the other main surface is seen from above.

FIG. 4(a) is a sectional view schematically illustrating an example of a known piezoelectric actuator. FIG. 4(b) is a plan view of the piezoelectric actuator shown in FIG. 4(a) when a first main surface is seen from above. FIG. 4(c) is a plan view of the piezoelectric actuator shown in FIG. 4(a) when the second main surface is seen from above. FIG. 4(a) is a sectional view taken along line 4a-4a in FIG. 4(b).

A piezoelectric actuator 4 shown in FIG. 4(a) includes a multilayer body 10D. The multilayer body 10D has a multilayer structure in which piezoelectric ceramic layers 20a, 20b, 20c, 20d, 20e, 20f, and 20g and planar electrodes 21a, 22a, 21b, 22b, 21c, 22c, 21d, and 22d are alternately stacked on each other.

The piezoelectric actuator 4 shown in FIG. 4(a) also includes a low-potential outer electrode 31 disposed on the first end surface 13 of the multilayer body 10D and a high-potential outer electrode 32 disposed on the second end surface 14 of the multilayer body 10D.

Among the planar electrodes, the planar electrodes 21a, 21b, 21c, and 21d are low-potential planar electrodes, each of which is electrically connected at one end to the low-potential outer electrode 31. Among the planar electrodes, the planar electrodes 22a, 22b, 22c, and 22d are high-potential planar electrodes, each of which is electrically connected at one end to the high-potential outer electrode 32. The low-potential planar electrodes 21a, 21b, 21c, and 21d and the high-potential planar electrodes 22a, 22b, 22c, and 22d are alternately disposed in the stacking direction and oppose each other with the piezoelectric ceramic layers 20a, 20b, 20c, 20d, 20e, 20f, and 20g interposed therebetween.

As shown in FIG. 4(a) and FIG. 4(b), the planar electrode positioned most outwardly on the side of the first main surface 11 of the multilayer body 10D is the low-potential planar electrode 21a. The inner surface of the low-potential planar electrode 21a contacts the – side of polarization in the active region 20X, while the outer surface of the low-potential planar electrode 21a is exposed on the outside of the multilayer body.

As shown in FIG. 4(a) and FIG. 4(c), the planar electrode positioned most outwardly on the side of the second main surface 12 of the multilayer body 10D is the high-potential planar electrode 22d. The inner surface of the high-potential planar electrode 22d contacts the + side of polarization in the active region 20X, while the outer surface of the high-potential planar electrode 22d is exposed on the outside of the multilayer body.

As shown in FIG. 4(a), the high-potential planar electrode 22a is located between the piezoelectric ceramic layers 20a and 20b. The high-potential planar electrode 22b is located between the piezoelectric ceramic layers 20c and 20d. The high-potential planar electrode 22c is located between the piezoelectric ceramic layers 20e and 20f. The low-potential planar electrode 21b is located between the piezoelectric ceramic layers 20b and 20c. The low-potential planar electrode 21c is located between the piezoelectric ceramic layers 20d and 20e. The low-potential planar electrode 21d is located between the piezoelectric ceramic layers 20f and 20g.

In a first comparative example, a piezoelectric actuator was fabricated similarly to the first example, except that the low-potential planar electrode 21a, the low-potential outer electrode 31, the high-potential planar electrode 22d, and the high-potential outer electrode 32 made of nichrome and Ag were formed by sputtering, as shown in FIG. 4(a), FIG. 4(b), and FIG. 4(c). The number of piezoelectric ceramic layers stacked on each other is seven.

Second Comparative Example

Outer electrodes, such as those shown in FIG. 4(a), FIG. 4(b), and FIG. 4(c), were formed on the piezoelectric ceramic base body (multilayer body) fabricated in the third example so that the structure of the piezoelectric ceramic base body would be similar to that in the first comparative example, and then, poling treatment was conducted. As a result, a piezoelectric actuator was fabricated.

[Reliability Evaluation]

Regarding the piezoelectric actuators fabricated in the first example, the second example, and the first comparative example, eight to twenty-two samples were prepared, and a DC voltage of 80 V (field strength: 4 kV/mm) was applied to the samples at a temperature of 85° C.

In this testing, a period of time required for each sample to short-circuit and discharge after the progress of insulation deterioration was set to be the lifetime. The mean time to failure was calculated by using the Weibull probability distribution.

Figure 5:
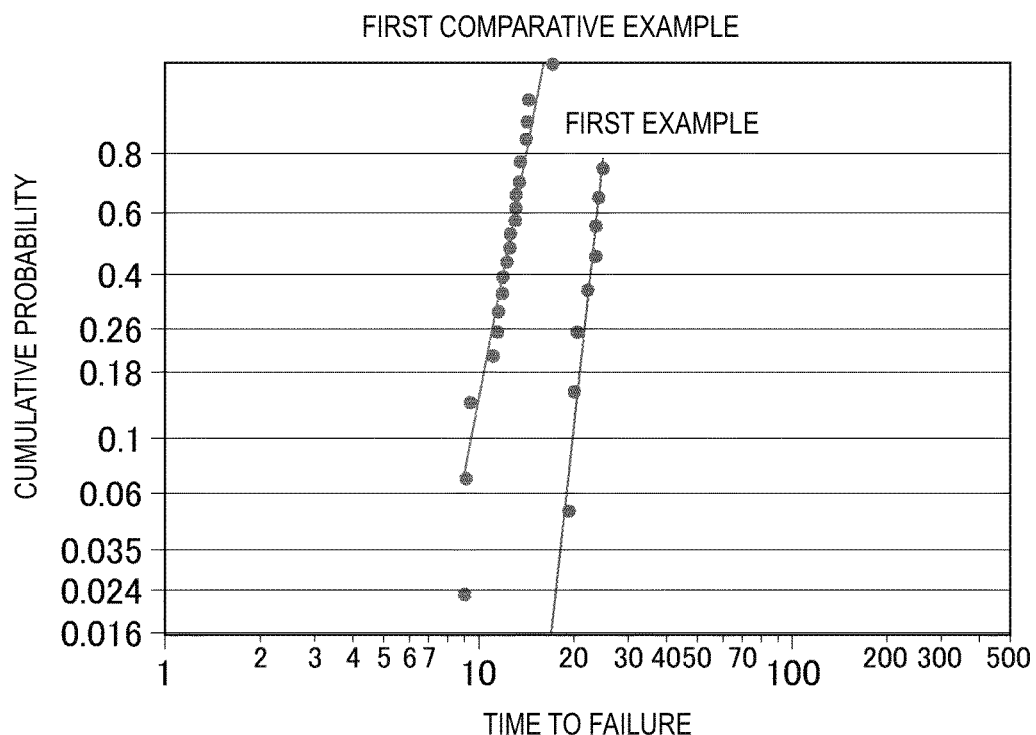
FIG. 5 is a graph illustrating the lifetime analysis in terms of the time to failure in a first example and a first comparative example.

FIG. 5 is a graph illustrating the lifetime analysis in terms of the time to failure in the first example and the first comparative example.

FIG. 5 shows that, while the mean time to failure in the first comparative example is 12.5 hours, the mean time to failure in the first example is 23.1 hours, that is, the lifetime of the first example is improved to be about twice as long as that of the first comparative example. Additionally, in the first example, all the piezoelectric ceramic layers contribute to the displacement, thereby obtaining high displacement characteristics.

Figure 6:
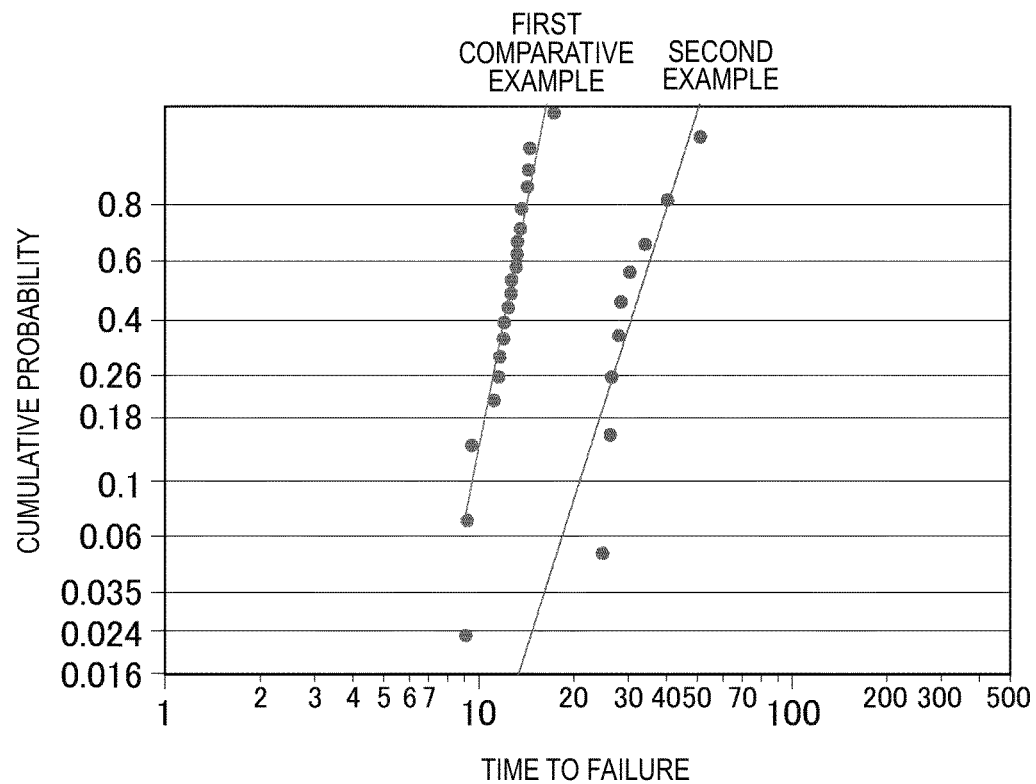
FIG. 6 is a graph illustrating the lifetime analysis in terms of the time to failure in a second example and the first comparative example.

FIG. 6 is a graph illustrating the lifetime analysis in terms of the time to failure in the second example and the first comparative example.

FIG. 6 shows that, while the mean time to failure in the first comparative example is 12.5 hours, the mean time to failure in the second example is 33.0 hours, that is, the lifetime of the second example is improved to be about 2.6 times as long as that of the first comparative example.

Regarding each of the piezoelectric actuators fabricated in the third example and the second comparative example, four samples were prepared, and a DC voltage of 80 V (field strength: 4 kV/mm) was applied to the samples at a temperature of 85° C. The lifetime was calculated in a manner similar to the first and second examples and the first comparative example.

In the third example, none of the four samples were failed even after a voltage was applied for 810 hours. In contrast, in the second comparative example, the respective four samples were failed after the application of a voltage for 3.1 hours, 61.7 hours, 42.7 hours, and 52.3 hours.

This shows that the structure of the third example achieves a much longer mean time to failure than that of the second comparative example.

REFERENCE SIGNS LIST 1, 2, 3, 4 piezoelectric actuator
10A, 10B, 10C, 10D multilayer body
11 first main surface
12 second main surface
13 first end surface
14 second end surface
15 first side surface
16 second side surface
20a, 20b, 20c, 20d, 20e, 20f, 20g piezoelectric ceramic layer
20X active region
21a, 21b, 21c, 21d low-potential planar electrode
22a, 22b, 22c, 22d high-potential planar electrode
31 low-potential outer electrode
32 high-potential outer electrode

The invention claimed is:

1. A piezoelectric actuator comprising:
a multilayer body including a plurality of alternately stacked piezoelectric ceramic layers and planar electrodes, the multilayer body having a first and second main surfaces opposing each other in a stacking direction, first and second end surfaces opposing each other in a longitudinal direction perpendicular to the stacking direction, and first and second side surfaces opposing each other in a widthwise direction perpendicular to the stacking direction and the longitudinal direction;
a low-potential outer electrode on the first end surface of the multilayer body and configured to receive a first potential; and
a high-potential outer electrode on the second end surface of the multilayer body and configured to receive a second potential, the second potential being higher than the first potential, wherein
the planar electrodes include a first set of low-potential planar electrodes electrically connected to the low-potential outer electrode, and a second set of high-potential planar electrodes electrically connected to the high-potential outer electrode, the first set of low-potential planar electrodes and the second set of high-potential planar electrodes are alternately arranged in the stacking direction, and, among the planar electrodes, planar electrodes within the multilayer body contain Ni as a primary component thereof,
the piezoelectric ceramic layers contain one of an alkali niobate compound and a barium titanate compound having a perovskite structure as a primary component of the piezoelectric ceramic layers, and define an active region in an area where the first set of low-potential planar electrodes and the second set of high-potential planar electrodes oppose each other, the active region being polarized in a direction from each low-potential planar electrode to a corresponding high-potential planar electrode,
a first most outwardly planar electrode on a side of the first main surface of the multilayer body is a first low-potential planar electrode of the first set of low-potential planar electrodes, and an inner surface of the first low-potential planar electrode contacts a − side of polarization in the active region, and an outer surface of the first low-potential planar electrode is exposed on an outside of the multilayer body, and on a side of the second main surface of the multilayer body, a first high-potential planar electrode of the second set of high-potential planar electrodes is not exposed on the outside of the multilayer body.

2. The piezoelectric actuator according to claim 1, wherein a second most outwardly planar electrode on the side of the second main surface of the multilayer body is a second low-potential planar electrode of the first set of low-potential planar electrodes, and an inner surface of the second low-potential planar electrode contacts the − side of polarization in the active region, and an outer surface of the second low-potential planar electrode is exposed on an outside of the multilayer body.

3. The piezoelectric actuator according to claim 1, wherein a second most outwardly planar electrode on the side of the second main surface of the multilayer body is a second low-potential planar electrode of the first set of low-potential planar electrodes, and an inner surface of the second low-potential planar electrode contacts the − side of polarization in the active region, and an outer surface of the low-potential planar electrode contacts an adjacent piezoelectric ceramic layer of the piezoelectric ceramic layers.

4. The piezoelectric actuator according to claim 1, wherein a second most outwardly planar electrode on the side of the second main surface of the multilayer body is a second high-potential planar electrode of the second set of high-potential planar electrodes, and an inner surface of the second high-potential planar electrode contacts a + side of polarization in the active region, and an outer surface of the second high-potential planar electrode contacts an adjacent piezoelectric ceramic layer of the piezoelectric ceramic layers.

5. The piezoelectric actuator according to claim 1, wherein the piezoelectric ceramic layers contain the alkali niobate compound as the primary component, the alkali niobate compound being expressed by a formula:

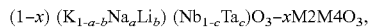
$(1-x)\,(K_{1-a-b}Na_aLi_b)\,(Nb_{1-c}Ta_c)O_3-xM2M4O_3,$ where M2 is a divalent metal element, M4 is a tetravalent metal element, and x, a, b, and c may be 0, and wherein
when x>0, M2M4O$_3$ forms a solid solution with the $(K_{1-a-b}Na_aLi_b)\,(Nb_{1-c}Ta_c)O_3,$
when a>0, part of the K is replaced with Na,
when b>0, part of the K is replaced with Li, and
when c>0, part of Nb is replaced with Ta.

6. The piezoelectric actuator according to claim 1, wherein the piezoelectric ceramic layers contain the barium titanate compound as the primary component, the barium titanate compound being expressed by a formula:

$\{Ba_{1-x}Ca_xO\}_mTiO_2+\alpha Re_2O_3+\beta MgO+\gamma MnO,$ where Re$_2$O$_3$ is at least one compound selected from Y$_2$O$_3$, Gd$_2$O$_3$, M$_2$O$_3$, Dy$_2$O$_3$, Ho$_2$O$_3$, Er$_2$O$_3$, and Yb$_2$O$_3$,
α, β, and γ represent a mole ratio, where
α:β:γ=2.5:2.2:1,
0.0002≤γ≤(−13.06m+13.54)/100,
0.995≤m≤1.011, and
x=0.13.

7. The piezoelectric actuator according to claim 1, wherein the low-potential outer electrode extends to the first and second main surfaces of the multilayer body, and the high-potential outer electrode extends to the first and second main surfaces of the multilayer body but does not overlap the active region.

8. A method for driving a piezoelectric actuator, the method comprising:
applying a first potential to the low-potential outer electrode of the piezoelectric actuator according to claim 1; and
applying a second potential to the high-potential outer electrode, the second potential being higher than the first potential,
wherein the first and second potentials have a same polarity or one of the first and second potentials is a ground potential.

9. The method for driving a piezoelectric actuator according to claim 8, wherein the first and second potentials have the same polarity.

10. The method for driving a piezoelectric actuator according to claim 9, wherein the first and second potentials are positive.

11. The method for driving a piezoelectric actuator according to claim 9, wherein the first and second potentials are negative.

12. The method for driving a piezoelectric actuator according to claim 8, wherein one of the first and second potentials is a ground potential.

13. The method for driving a piezoelectric actuator according to claim 12, wherein the first potential is negative and the second potential is the ground potential.

14. The method for driving a piezoelectric actuator according to claim 12, wherein the first potential is the ground potential and the second potential is a positive potential.

* * * * *